United States Patent [19]
Fredrickson

[11] Patent Number: 6,104,765
[45] Date of Patent: Aug. 15, 2000

[54] ASYMMETRIC CHANNEL DATA DETECTION COMPENSATION

[75] Inventor: Lisa Fredrickson, Ojai, Calif.

[73] Assignee: Seagate Technology, Inc., Scotts Valley, Calif.

[21] Appl. No.: 08/930,877

[22] PCT Filed: Jul. 22, 1997

[86] PCT No.: PCT/US97/13106

§ 371 Date: Oct. 7, 1997

§ 102(e) Date: Oct. 7, 1997

[87] PCT Pub. No.: WO98/04032

PCT Pub. Date: Jan. 29, 1998

Related U.S. Application Data

[60] Provisional application No. 60/022,245, Jul. 22, 1996.

[51] Int. Cl.[7] .............................. H04L 27/06; H03D 1/00; G11B 3/90; H04N 5/76
[52] U.S. Cl. .......................... 375/340; 375/341; 375/348; 375/262; 375/263; 375/265; 375/291; 360/39; 360/41; 369/59
[58] Field of Search .................................... 375/340, 341, 375/262, 263, 265, 291, 348; 360/41, 39; 369/59

[56] References Cited

U.S. PATENT DOCUMENTS

| | | | |
|---|---|---|---|
| 4,571,734 | 2/1986 | Dolivo et al. | 375/18 |
| 4,644,564 | 2/1987 | Dolivo et al. | 375/18 |
| 5,258,933 | 11/1993 | Johnson et al. | 364/60 |
| 5,341,387 | 8/1994 | Nguyen | 371/45 |
| 5,345,342 | 9/1994 | Abbott et al. | 360/48 |
| 5,450,445 | 9/1995 | Ushirokawa | 375/324 |
| 5,517,476 | 5/1996 | Hayashi | 369/59 |
| 5,581,581 | 12/1996 | Sato | 375/341 |
| 5,650,988 | 7/1997 | Kuribayashi | 369/59 |
| 5,661,760 | 8/1997 | Patapoutian et al. | 375/341 |
| 5,757,855 | 5/1998 | Strolle et al. | 375/262 |
| 5,796,788 | 8/1998 | Bottomley | 375/341 |
| 5,809,079 | 9/1998 | Hayashi | 375/262 |
| 5,841,796 | 11/1998 | Snyder, Jr. | 371/43.6 |

*Primary Examiner*—Stephen Chin
*Assistant Examiner*—Michael W. Maddox
*Attorney, Agent, or Firm*—Shawn B. Dempster; Edward P. Heller, III

[57] ABSTRACT

A data symbol sequence detector for choosing data symbol sequences likely to be represented by corresponding sequences of samples received by the detector with these sample sequences formed by sampling data signals obtained from magnetically stored data through a data retrieval channel which asymmetrically affects the magnitudes of the data signals. An expected sample value estimator provides estimated expected magnitude values for a selected set of samples in the sequence, and a magnitude difference determiner is used for obtaining representations of differences between values of the samples in the sequence and the corresponding estimated expected values. These differences representations can be limited in algebraic form.

8 Claims, 9 Drawing Sheets

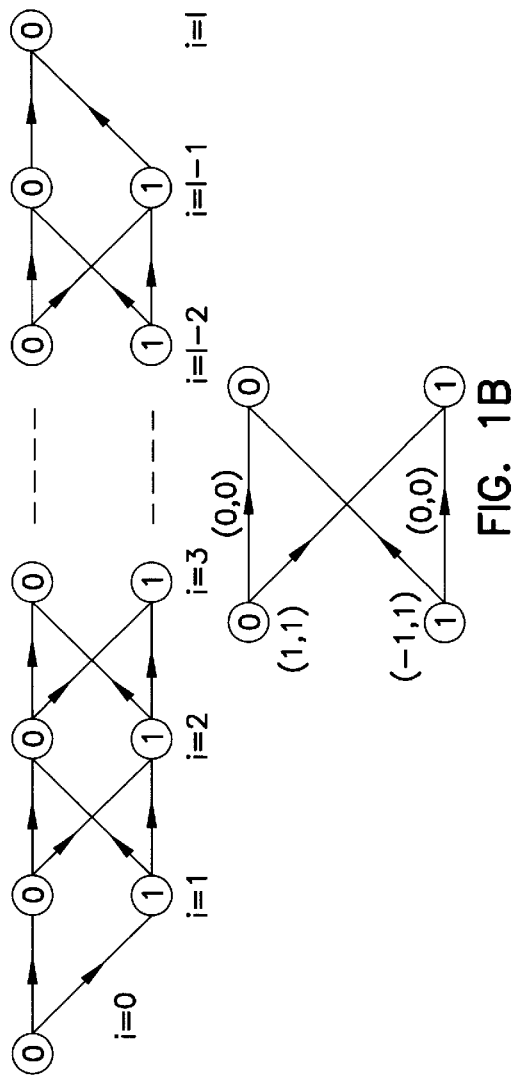
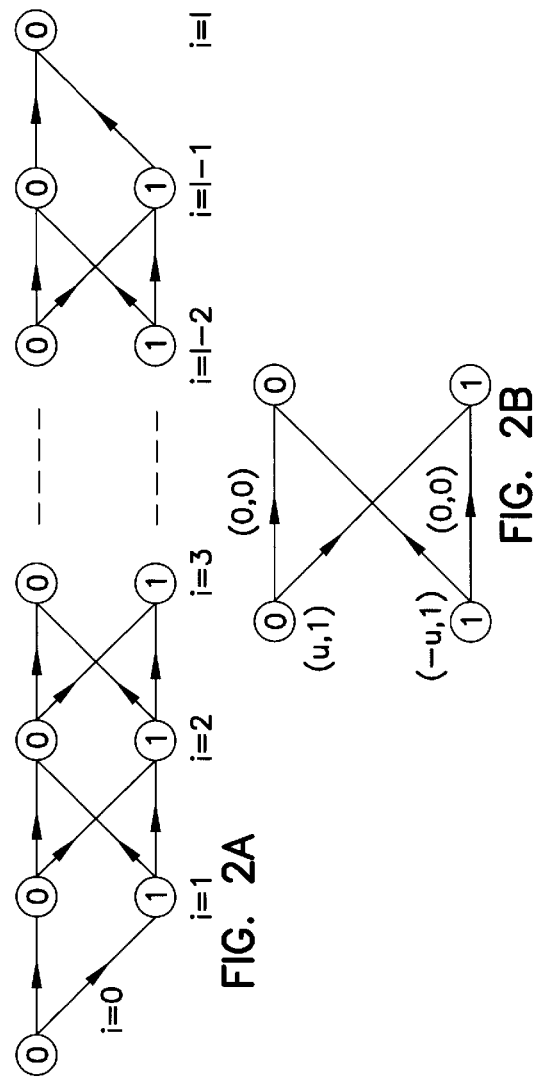

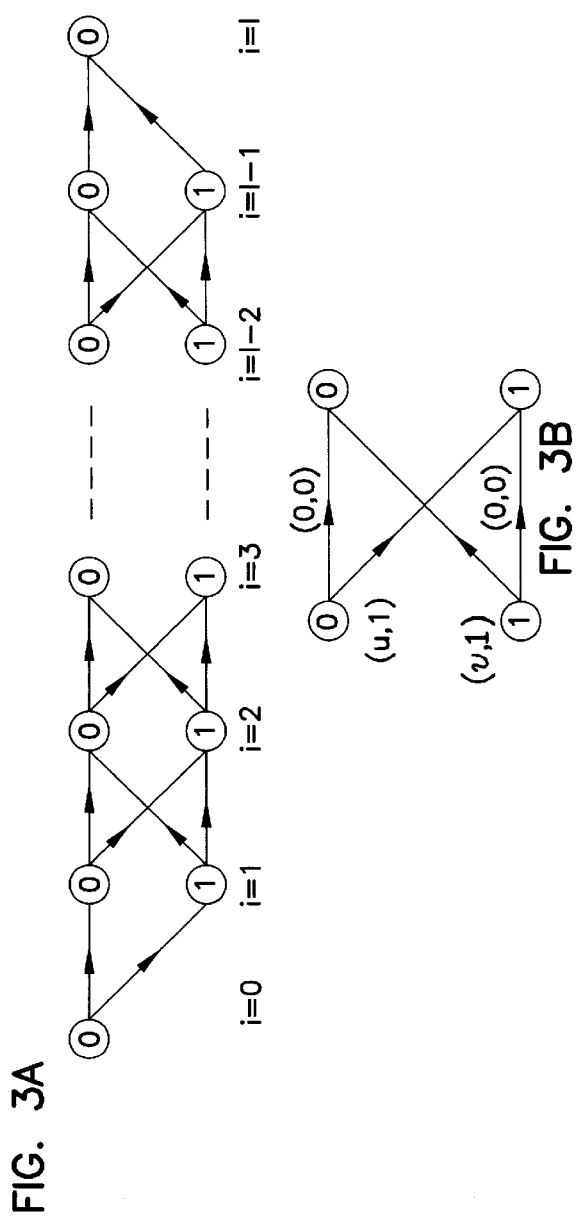
FIG. 3A
FIG. 3B
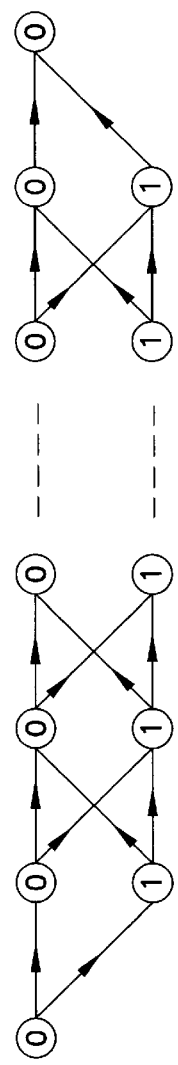
FIG. 4A
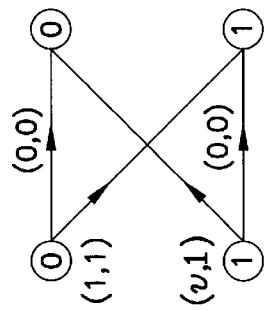
FIG. 4B

ASYMMETRIC CHANNEL DATA DETECTION COMPENSATION

CROSS-REFERENCE TO RELATED APPLICATION

This application claims priority from Provisional Application No. 60/022,245, filed Jul. 22, 1996.

BACKGROUND OF THE INVENTION

The present invention relates to information storage systems and, more particularly, to detection of data retrieved from storage in such systems.

Digital data magnetic recording systems store digital data by recording same in a moving magnetic media layer using a storage, or "write", electrical current-to-magnetic field transducer, or "head", positioned immediately adjacent thereto. The data is stored or written to the magnetic media by switching the direction of flow in an otherwise substantially constant magnitude write current that is established in coil windings in the write transducer in accordance with the data. Each write current direction transition results in a reversal of the magnetization direction, in that portion of the magnetic media just then passing by the transducer during this directional switching of the current flow, with respect to the magnetization direction in that media induced by the previous in the opposite direction. In one recording scheme, often termed nonreturn-to-zero inverted (NRZI), each magnetization direction reversal occurring over a short portion of the magnetic media moving past the transducer represents a binary number system digit "1", and the lack of any such reversals in that portion represents a binary digit "0".

Recovery of such recorded digital data is accomplished through positioning a retrieval, or "read" magnetic field-to-voltage transducer, (which may be the same as the storage transducer if both of these transducers rely on inductive coupling between the media fields and the transducer) or "head", is positioned to have the magnetic media, containing previously stored data, pass thereby. Such passing by of the media adjacent to the transducer permits the flux accompanying the magnetization reversal regions in that media either to induce a corresponding voltage pulse in forming an analog output read signal for that retrieval transducer or, alternatively, change a transducer circuit parameter to thereby provide such an output signal voltage pulse. In the coding scheme described above, each such voltage pulse in the read transducer output signal due to the reversal of magnetization directions between adjacent media portions is taken to represent a binary digit "1", and the absence of such a pulse in corresponding media portions is taken to represent a binary digit "0".

Digital data magnetic recording systems have used peak detection methods for the detection of such voltage pulses in the retrieved analog signal as the basis for digitizing this signal. Such methods are based on determining which peaks in that signal exceed a selected threshold to determine that a binary digit "1" related pulse occurred in the retrieved signal, and also use the times between those voltage pulses to reconstruct the timing information used in the preceding recording operation in which the data were stored in the magnetic media as described above. The analog retrieved signal is provided to a phase-locked loop forming a controlled oscillator, or a phase-lock oscillator or synchronizer, which produces an output timing signal, or "clock" signal, from the positions of the detected peaks in this analog retrieved signal. Absolute time is not used in operating the data retrieval system portion since the speed of the magnetic media varies over time during both the storage operation and the retrieval operation to result in nonuniform time intervals, or nonuniform multiples thereof, occurring between the voltage pulses in the analog retrieved signal.

There is always a desire in magnetic recording systems to devote less of the magnetic media along a track therein to the storage of a bit to thereby permit increasing the density of the bits stored. The use of peak detection places a limit on the density of bits along a track because increasing that density beyond some point will lead to too much intersymbol interference which in turn leads to errors in the recovery of data using such peak detection methods. Because of this limit, recent increases in bit density along a track in a magnetic media have come with the acceptance of a controlled, or known, amount of intersymbol interference which, since known, allows detection of the pulses involved despite this interference. The read transducer analog output signal generated from the binary bits or symbols stored in the magnetic media is sampled with the resulting samples being converted to digital data, and the samples are taken at a rate which leads to more than one sample per pulse rather than the single sample per pulse which would be sufficient for peak detection if sampling was used therewith. Since each individual sample reflects only part of the pulse response, this process used in a system results in referring to such a system as a partial response system.

A digital data magnetic recording system comprises a bandpass data retrieval channel in that it is unable to transmit very low frequencies, and has an upper frequency beyond which its transmission is also quite poor. Although there are a number of possible alternative partial response system arrangements, there is substantial value in matching the partial response spectrum to that expected for the data to be transmitted in the channel. A relatively simple partial response system that does not require transmission at very low frequencies is known as a class 4 partial response system, and is typically used in magnetic digital data recording systems. Such a response is obtained by providing an overall channel and filter response equal to that of the sum of two opposite polarity Nyquist channel impulse responses separated in time by two sample intervals. Such an arrangement will lead to a filter analog output signal from which ideally can be obtained three alternative possible sample values of $-1$, $0$ and $1$ for an input signal based on binary recorded data if sampled at appropriate instants. The sequence of resulting samples can be viewed as comprising an interleaving of two subsequences, one formed of the odd numbered samples and the other formed of the even numbered samples, in view of each sample value having contributions from only the currently retrieved stored datum and second preceding datum.

A read transducer analog output signal provided through any kind of a data retrieval channel is subject to containing errors therein as a result due to noise, timing errors, gain errors, channel asymmetries and the like encountered in the course of retrieval. As opposed to attempting to determine individually the value represented by every pulse in the read signal as in peak detection, maximum likelihood detection of sequences of such samples is used instead involving estimating which of several possible transmitted symbol sequences caused the received sample sequence based typically on finding the minimum mean squared error between these received samples and each of the possible symbol sequences that may have generated these samples and choosing that symbol sequence giving the smallest such error.

A class 4 partial response system channel can be decomposed into two half-rate channels one of which receives the even-numbered input sample sequence and the other of which receives the odd-numbered input sample sequence to thereby form two dicode channels. Detection of the data represented by these samples provided to each dicode channel can be done independently. Such a dicode channel resulting from this decomposition has an impulse response equal to that of the sum of two opposite polarity Nyquist channel impulse responses separated in time by one dicode data symbol interval based on a one-half full channel sample rate period, this dicode channel resulting in samples of the channel output signal in the absence of random noise having values of $$y_i = x_i - x_{i-1},$$

where $x_i$ is a data symbol input taken as having binary a value of "1" or "0" to the channel that is obtained from the magnetic recording media at sample interval i, $x_{i-1}$ is a similar binary value input to the channel but occurring a dicode channel rate period earlier and reflecting the channel memory, and $y_i$ is the channel response analog output signal at interval i after amplification and filtering. When such channel gain and filtering are applied ideally, and the channel is noiseless, $y_i$ will take on the ideal values of −1, 0 or 1. Otherwise, $y_i = x_i - x_{i-1} + n_i$ where $n_i$ is an independent random variable of zero mean representing the additive noise at the sampling instant.

Because of the channel memory, the occurrence of errors in a class 4 partial response system can propagate in the detection system resulting in more errors. This unwanted result can be obviated by appropriately precoding the data to be stored in the magnetic media prior to such storage. The detection process over time for a dicode channel receiving such precoded data can be illustrated by a two state trellis diagram such as that shown in FIG. 1A showing the possible sequence of detection system states resulting from transitions therebetween that can evolve over time. FIG. 1B shows two states, designated "0" and "1", after some sample interval and the transitions between these states which can occur on obtaining the next data symbol after the subsequent sample interval. Each transition is represented by an arrow, or branch, with a pair of values in parentheses adjacent thereto showing a possible next expected data sample after being in the preceding state on the left, and the corresponding data symbol value on the right. The trellis diagram of FIG. 1A is shown assuming the detection system was initially in the "0" state and is depicted for a sequence of samples of arbitrary length, the diagram having each sample interval marked below the corresponding states the system could be in at that instant. A sequence of contiguous branches from the beginning to the end is a path through the diagram corresponding to a possible input sequence of data symbol values.

A maximum likelihood sequence detector for such a dicode channel is provided by defining a branch metric based on finding the "Euclidean distance" between an observed sample value and anticipated possible sample values for each branch of the trellis diagram at each sampling interval multiple i as a measure of how close the observed sample, $y_i$, in the presence of random noise, is to the possible expected sample value at that branch. Thus, for a branch corresponding to a transition from a "1" state to a "0" state at time i, the branch metric $B_{in}$, in view of expecting a −1 sample value, is $$B_{in}(y_i+1)^2 = y_i^2 + 2y_i + 1,$$

assuming additive, zero mean noise is present in the channel. The branch metric $B_{ip}$ corresponding to a trellis diagram transition from a "0" state to a "1" state at time i, in view of expecting a +1 sample value, is $$B_{ip} = (y_i-1)^2 = y_i^2 - 2y_i + 1.$$

Finally, the branch metric $B_{iz}$ corresponding to either of the transitions from either of the states in the trellis diagram to the same state, i.e. from either state "0" to state "0" or from state "1" to state "1", at time i, in view of expecting a 0 sample value, is $$B_{iz} = (y_i-0)^2 = y_i^2.$$

In the foregoing equations, the presence of common values in each of the equations does nothing to aid the detector in distinguishing between the values of the branch metrics, and thus, the term $y_i^2$ can be dropped from each of these metrics. Similarly, multiplying each of the metrics by a common factor does nothing to alter the ability of the detector to distinguish between the distances represented thereby, and so each of the metrics can be multiplied by a factor of one-half. A further possibility is to drop common factors in each metric to ease computation. Hence, the standard metrics used for such a maximum likelihood detector can be made quite simple to ease the computations of the branch metrics by using the following metrics rather than the above or original Euclidean distance based metrics yielding $$B_{in} = y_i + \frac{1}{2}$$

and $$B_{ip} = \frac{1}{2} - y_i.$$

$$B_{iz} = 0,$$

The maximum likelihood sequence detector could then calculate such branch metrics for every branch in the trellis diagram. Each path through that trellis diagram can have a corresponding path metric calculated for it which is the sum of the branch metrics occurring therein. The path through the trellis diagram with the smallest path metric is chosen as the most likely path, and the anticipated channel output samples corresponding to that path are chosen as the most likely sequence of binary inputs to the channel.

However, as the trellis diagram expands in length over time, resort must be had to the Viterbi algorithm since continuing such calculations for the entire path quickly grows beyond the capabilities of any reasonable calculating and memory capacities provided for such purpose. As the path metric for any path through any state node in the trellis diagram is the sum of the partial path metrics for those portions of the path to the left of the node and to the right of any node, a detector need only choose the smallest partial path metric to the left of the node, i.e. the survivor path for that node. The detector needs to find and retain the survivor path for each node until the final node of the trellis diagram is reached, for instance, at the end of a code word, and then note the survivor path for that node to determine the optimal path metric.

Although additive random noise of zero mean value was considered in the foregoing, data retrieval or read channels, including dicode read channels, are subject to deficiencies in addition to random noise. Such deficiencies can include gain errors across the channel and offset errors or other asymmetries in addition to such random noise. In these circumstances, use of the foregoing standard branch metrics can lead to additional unwanted error in the detection process. Thus, there is desired a Viterbi detector using metrics which will result in reduced errors but without undue data manipulation and computational complexity.

BRIEF SUMMARY OF THE INVENTION

The present invention provides a data symbol sequence detector for choosing data symbol sequences likely to be represented by corresponding sequences of samples received by the detector with these sample sequences being formed by sampling data signals obtained from magnetically stored data through a data retrieval channel which asymmetrically affects the magnitudes of the data signals. The detector has an expected sample value estimator to provide estimated expected magnitude values for at least one corresponding selected set of samples in the sequence of samples. In addition, a magnitude difference determiner is used for obtaining representations of differences between values of the samples in the sequence of samples and the corresponding estimated expected values received from the expected sample value estimator. These differences representations can be found subject to selected algebraic form limitations on the samples and estimated expected values involved.

BRIEF DESCRIPTION OF THE DRAWINGS

FIGS. 1A and 1B show diagrams representing possible data detector behavior in a certain data retrieval channel circumstance, FIGS. 2A, 2B, 3A, 3B, 4A and 4B show diagrams representing possible data detector behavior in alternative data retrieval channel circumstances.

DETAILED DESCRIPTION OF THE PREFERRED EMBODIMENTS

Figure 5:
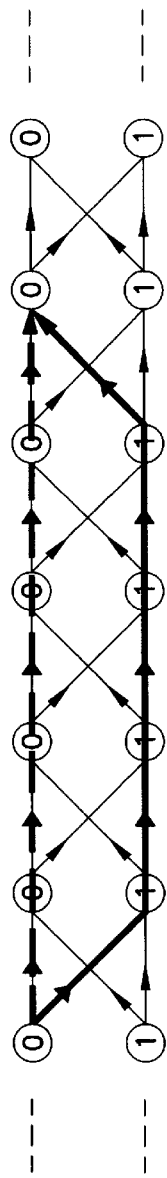
FIG. 5 shows a diagram representing possible data detector behavior in a certain data retrieval channel circumstance.

FIGS. 2A and 2B show a trellis diagram that is more representative of conditions in a practical magnetic recording device data retrieval or read channel. As can be seen in FIG. 2A, the trellis diagram is still that of a two-state channel but the section of that trellis diagram shown in FIG. 2B indicates the output values of the channel are more typically $$s_i = Ay_i,$$

where $s_i$ is the sample value in the presence of possible gain and noise errors because of errors occurring in the gain A and because of the presence of noise at the sample instant represented by $n_i$ in $y_i = x_i - x_{i-1} + n_i$. Such noise samples can be considered independent random variables at each sampling instant having a mean value of zero, as above, and a variance of $\sigma^2$. The factor A is the gain across the entire channel from the recording media to the channel output. The section of the trellis diagram in FIG. 2B shows the expected sample value from the channel response analog output signal to be u during transitions from a present state to an opposite state with u representing the expected statistical mean value of magnitudes of samples obtained from the channel output signal for a channel subject to gain error instead of the anticipated values of −1 and 1 that would be received from an ideal noiseless channel.

A further problem which can occur in a read channel is asymmetry in a channel response to the binary input values of "0" and "1". One typical source of such asymmetry in a read channel occurs with the use of a magnetoresistive transducer in the read head which often provides a different magnitude output when reading a magnetization transition from the magnetic media in going from a first state to an opposite state than when making a transition from an alternative second state to an opposite state. Again, the trellis diagram in FIG. 3A illustrates the detection process in such circumstances with the trellis diagram section shown in FIG. 3B indicating the expected sample values from the channel response analog output signal will differ from the anticipated values of 1 and −1 at the output of an ideal noiseless channel, and each possibly differing by different amounts from such anticipated values to thereby reflect such asymmetry. In these circumstances, the output sample can be written as $$s'_i = \begin{cases} u + n_i, & \text{if } x_i - x_{i-1} = 1 \\ n_i, & \text{if } x_i - x_{i-1} = 0 \\ v + n_i, & \text{if } x_i - x_{i-1} = -1 \end{cases}$$

with u representing the expected statistical mean value of magnitudes of samples taken from the signal received at the channel output for a channel subject to gain error and asymmetry instead of the anticipated values of 1 that would be received from an ideal noiseless channel. In addition, υ represents the expected statistical mean value of magnitudes of such samples instead of the anticipated value of −1 that would be received from an ideal noiseless channel. Here, $n_i$ is again an independent Gaussian random variable with a mean of 0 and a variance of $\sigma^2$.

The corresponding branch metrics in these circumstances reflect these altered expected sample value means. Thus, for a branch corresponding to a transition from a "1" state to a "0" state at time i, the branch metric $B_{in}$, in view of expecting a υ mean sample value, is $$B_{in} = (s'_i - \upsilon)^2 = s'^2_i - 2\upsilon s'_i + \upsilon^2.$$

The branch metric $B_{ip}$ corresponding to a trellis diagram transition from a "0" state to a "1" state at time i, in view of expecting a u mean sample value, is $$B_{ip} = (s'_i - u)^2 = s'^2_i - 2us'_i + u^2.$$

Finally, the branch metric $B_{iz}$ corresponding to either of the transitions from either of the states in the trellis diagram to the same state, i.e. from either state "0" to state "0" or from state "1" to state "1", at time i, in view of expecting a 0 sample value, is $$B_{iz} = (s'_i - 0)^2 = s'^2_i.$$

These can again be simplified as in the manner described above to yield $B_{in} = \upsilon/2 - s'_i$, $B_{ip} = u/2 - s'_i$ and $B_{iz} = 0$.

However, the representation for $s'_i$ can be simplified without loss of generality by forcing u to equal 1 in the detection system to correct any gain error thereby leaving υ to represent the effects of channel asymmetry. The trellis diagram of FIG. 4A illustrates this situation with the trellis section shown in FIG. 4B indicating the expected sample values from the channel response analog output signal will differ from only the anticipated value of −1 at the output of an ideal noiseless channel. Correspondingly, the magnitudes of the samples from the channel response output analog signal can be written as $$r_i = \begin{cases} 1 + n_i, & \text{if } x_i - x_{i-1} = 1 \\ n_i, & \text{if } x_i - x_{i-1} = 0 \\ v + n_i, & \text{if } x_i - x_{i-1} = -1 \end{cases}$$

with $r_i$ now designating the recovered sample magnitude. The fall Euclidian distance branch metrics in this situation become, first, for a branch corresponding to a transition from a "1" state to a "0" state at time i, $B_{in}$, in view of expecting a $\upsilon$ mean sample value, is $$B_{in} = (r_i - \upsilon)^2 = r_i^2 - 2\upsilon r_i + \upsilon^2.$$

The branch metric $B_{in}$ corresponding to a trellis diagram transition from a "0" state to a "1" state at time i, $B_{ip}$, in view of expecting a +1 mean sample value, is $$B_{ip} = (r_i - 1)^2 = r_i^2 - 2r_i + 1.$$

Finally, the branch metric $B_{iz}$ corresponding to either of the transitions from either of the states in the trellis diagram to the same state, i.e. from either state "0" to state "0" or from state "1" to state "1", at time i, $B_{iz}$, in view of expecting a 0 sample value, is $$B_{iz} = (r_i - 0)^2 = r_i^2.$$

In the foregoing equations, the presence of common values in each of the equations does nothing to aid the detector in distinguishing between the values of the branch metrics, and thus, the term $r_i^2$ can be dropped from each of these metrics. Similarly, multiplying each of the metrics by a common factor does nothing to alter the ability of the detector to distinguish between the distances represented thereby, and so each of the metrics can be multipled by a factor of one-half to yield the optimal branch metrics $B_{in} = \upsilon^2/2 - \upsilon r_i$, $B_{ip} = \frac{1}{2} - r_i$ and $B_{iz} = 0$. Again, to ease computation, the common factor in the terms for $B_{in}$ as last written can be dropped to provide simplified metrics for a maximum likelihood detector to reduce the computations of the branch metrics by using the resulting metrics rather than the original Euclidean distance based metrics, or the optimal branch metrics just set out, to give the simplified branch metrics $$B_{in} = r_i - \upsilon/2$$

$$B_{iz} = 0,$$

and $$B_{ip} = \frac{1}{2} - r_i.$$

The suitability of these various branch metrics for use in obtaining the proper data symbol sequence corresponding to a sequence of samples received at the sequence detector system input can be gauged by the relative error rates resulting from such uses. There will be some correct state sequence, or path, through the trellis diagram representing the detection process for the data symbol sequence recovered from storage in the magnetic media, and there will be a state sequence, or path, through the trellis diagram reflecting the selections of the detection system using the Viterbi algorithm. Due to conditions in the retrieval channel, errors can occur from time to time so that these two paths in the trellis diagram will correspondingly separate and thereafter merge together again. Each of such occurrences is termed an error event of a length depending on how many incorrect states occur between such a separation and the subsequent remerging of the paths.

An example of such an error event is shown in the trellis diagram of FIG. 5. An example path through all "0" states is shown in heavy or thickened solid line form, and an alternative path from the initial "0" state to the final "0" state of the previous path is shown in heavy or thickened dashed line form. If a sequence of expected zero value samples extending for k samples is denoted by $0_k$, the solid line path can be denoted by $\{0_k\}$ and the dashed line path can correspondingly be denoted by $\{1\ 0_k\upsilon\}$. The notation $E_{x-y}$ is used to denote an should result from sampling the channel output signal based on the data symbols stored in the magnetic media but in which expected sample sequence y instead is selected to have occurred by the detection system. Thus, FIG. 5 shows two possibilities for error events, the first represented by $E_{0_k \rightarrow 1\ 0_{k-2}\upsilon}$, in which the dashed line path should result based on the stored data but in which the solid line path was incorrectly selected. In the second error event possibility represented by $E_{1\ 0_{k-2}\upsilon \rightarrow 0_k}$ the roles of the solid line path and the dashed line path are reversed.

The various possibilities for a dicode channel detection process minimum distance error events are shown in the following table. These possibilities are sufficient to consider since, for sufficient signal to noise ratios, the probabilities of symbol selection errors are dominated by the probabilities of minimum distance error events. The minimum distance error event probabilities to be determined below are assigned values $P_x$ and are listed in the table for each error event under the different branch metrics set out above which give rise to those probabilities for that error event.

| Event | Optimal $P_e$ | Simplified $P_e$ | Standard $P_e$ |
|---|---|---|---|
| $E_{0_k \rightarrow 1 0_{k-2}\upsilon}$ | $P_1$ | $P_4$ | $P_2$ |
| $E_{1 0_{k-2}\upsilon \rightarrow 0_k}$ | $P_1$ | $P_4$ | $P_3$ |
| $E_{\upsilon 0_{k-2} 1 \rightarrow 0_k}$ | $P_1$ | $P_4$ | $P_3$ |
| $E_{0_k \rightarrow \upsilon 0_{k-2} 1}$ | $P_1$ | $P_4$ | $P_2$ |
| $E_{0_k \rightarrow \upsilon 0_{k-2} 1}$ | $P_1$ | $P_4$ | $P_2$ |
| $E_{1 0_k \rightarrow 0_k 1}$ | $P_2$ | $P_2$ | $P_2$ |
| $E_{0_k 1 \rightarrow 1 0_k}$ | $P_2$ | $P_2$ | $P_2$ |
| $E_{0_k \upsilon \rightarrow \upsilon 0_k}$ | $P_3$ | $P_3$ | $P_3$ |
| $E_{\upsilon 0_k \rightarrow 0_k \upsilon}$ | $P_3$ | $P_3$ | $P_3$ |

Consider first the optimal branch metrics set out above as $B_{in} = \upsilon^2/2 - \upsilon r_i$, $B_{ip} = \frac{1}{2} - r_i$ and $B_{iz} = 0$. The accumulated optimal branch metrics over the two paths in FIG. 1, $B_s$ designating the accumulated optimal branch metric for the solid line path and $B_d$ being the designator for the dashed line path, are $$B_s = v^2/2 - vr_j + \frac{1}{2} - r_i \text{ and } B_d = 0,$$

where $r_i$ is the sample value corresponding to the initial path transition in the solid line path from the dashed line path and $r_j$ is the sample corresponding to the final path transition in the solid line path, and where terms for the separate samples in both paths having zero value metrics are omitted. The Viterbi detector chooses the top or dashed line path if $B_d < B_s$, i.e., if $$0 < v^2/2 - vr_j + \frac{1}{2} - r_j,$$

but chooses the bottom or solid line path if the inequality is reversed. This is equivalent to choosing the top path if $$vr_j + r_i < \frac{1+v^2}{2}.$$

Let $r \triangleq vr_j + r_i$. Then r is a Gaussian random variable with variance $\sigma_r^2 = E\{[1(r_j-1)]^2\} + E\{[\upsilon(r_i-\upsilon)]^2\} = \sigma^2 + \upsilon^2\sigma^2 = (1+\upsilon^2)\sigma^2$. If the solid line path represents the data symbols actually stored, then the mean value of r is $\mu_s = E\{r\} = E\{\upsilon r_j\} + E\{r_i\} = \upsilon \cdot \upsilon + 1 = 1 + \upsilon^2$. Therefore, the conditional probability of the error event $E_{10_{k-2}\upsilon \to 0_k}$, given that the solid line path corresponds to the stored data, is given by integrating the Gaussian probability density function for r over the range thereof in which its value satisfies the last inequality above that corresponds to the erroneous choice of the dashed line path by the detector rather than the solid line path, or $$P[E_{10_{k-2}v \to 0_k}] = \frac{1}{\sigma_r \sqrt{2\pi}} \int_{-\infty}^{x} \exp\left[-\frac{(z-\mu_s)2}{2\sigma_r^2}\right] dz$$

where z, as a dummy variable, is used in place of r and $$x \triangleq \frac{1+v^2}{2}$$

is the detection threshold in view of the last inequality above. By making the change of variable, $$y \triangleq \frac{z-\mu_s}{\sigma_r},$$

one finds that $$P[E_{10_{k-2}v \to 0_k}] = \frac{1}{\sqrt{2\pi}} \int_{-\infty}^{\frac{x-\mu_s}{\sigma_r}} \exp[-y^2/2] dy.$$

If the dashed line path is corresponds to the stored data, then the mean of r is $\mu_d = 0$. The probability of the error event $E_{0_k \to 10_{k-2}\upsilon}$ is given by integrating the Gaussian probability density function for r in the manner above over the range thereof in which its value does not satisfy the last inequality above so as to correspond to the erroneous choice of the solid line path by the detector rather than the dashed line path, or $$P[E_{0_k \to 10_{k-2}v}] = \frac{1}{\sigma_r \sqrt{2\pi}} \int_{x}^{\infty} \exp\left[-\frac{(z-\mu_d)^2}{2\sigma_r^2}\right] dz.$$

Making the substitution $$y \triangleq \frac{z-\mu_d}{\sigma_r},$$

one finds that $$P[E_{0_k \to 10_{k-2}v}] = \frac{1}{\sqrt{2\pi}} \int_{\frac{x-\mu_d}{\sigma_r}}^{\infty} \exp\left[-\frac{y^2}{2}\right] dy$$

$$= \frac{1}{2} - \frac{1}{\sqrt{2\pi}} \int_{0}^{\frac{x-\mu_d}{\sigma_r}} \exp\left[-\frac{y^2}{2}\right] dy.$$

These two probabilities can be expressed in terms of the error functions $$\Phi(w) = \frac{1}{\sqrt{2\pi}} \int_{-\infty}^{w} \exp\left[-\frac{z^2}{2}\right] dz \text{ and}$$

$$\text{erf}(w) = \frac{2}{\sqrt{\pi}} \int_{0}^{w} \exp[-z^2] dz.$$

The probability of the error event $E_{10_{k-2}\upsilon \to 0_k}$ given above is then $$P[E_{10_{k-2}v \to 0_k}] = \Phi\left(\frac{x-\mu_s}{\sigma_r}\right).$$

For any w<0, we have $$\Phi(w) = \frac{1}{\sqrt{2\pi}} \int_{-\infty}^{w} \exp\left[-\frac{z^2}{2}\right] dz$$

$$= \frac{1}{2} - \frac{1}{\sqrt{2\pi}} \int_{0}^{-w} \exp\left[-\frac{z^2}{2}\right] dz$$

$$= \frac{1}{2}\left[1 - \text{erf}\left(\frac{w}{\sqrt{2}}\right)\right].$$

So, for $$w \triangleq \frac{x-\mu_s}{\sigma_r} = \frac{\frac{1+v^2}{2} - (1+v^2)}{(1+v^2)\sigma^2} = -\frac{\sqrt{1+v^2}}{2\sigma},$$

there results $$P[E_{10_{k-2}v \to 0_k}] = \Phi\left(-\frac{\sqrt{1+v^2}}{2\sigma}\right) = \frac{1}{2}\left[1 - \text{erf}\left(\frac{\sqrt{1+v^2}}{2\sqrt{2}\,\sigma}\right)\right].$$

The probability of the error event $E_{0_k \to 10_{k-2}\upsilon}$ can be reexpressed as $$P[E_{0_k \to 10_{k-2}v}] = \frac{1}{2}\left[1 - \text{erf}\left(\frac{\sqrt{1+v^2}}{2\sqrt{2}\,\sigma}\right)\right].$$

Thus, these two error events can be simply represented by defining $$P_1 \triangleq P[E_{10_{k-2}v \to 0_k}] = P[E_{0_k \to 10_{k-2}v}] = \frac{1}{2}\left[1 - \text{erf}\left(\frac{\sqrt{1+v^2}}{2\sqrt{2\sigma}}\right)\right].$$

The analyses for the error events $E_{\upsilon 0_{k-2}1 \to 0_k}$ and $E_{0_k \to \upsilon 0_{k-2}1}$ are similar, in that the accumulated branch metrics for the alternative solid and dashed line paths are $$B_s = v^2/2 - vr_i + \frac{1}{2} - r_j \text{ and } B_d = 0.$$

The Viterbi detector chooses the dashed line path if $B_d < B_s$, i.e., if $$0 < v^2/2 - vr_i + \frac{1}{2} - r_j,$$

but chooses the solid line path if the inequality is reversed. This is equivalent to choosing the dashed line path if $$vr_i + r_j < \frac{1+v^2}{2}.$$

Let $r \triangleq vr_i + r_j$. Then r is a Gaussian random variable with variance $\sigma_r^2 = (1+v^2)\sigma^2$. The mean of r is either $\mu_s = 1+v^2$ or $\mu_d = 0$ depending on which of the paths the data stored in the magnetic media corresponds to, and once again, $$P_1 = P[E_{0_k \rightarrow v0_{k-2}1}] = P[E_{v0_{k-2}1 \rightarrow 0_k}].$$

For the error events $E_{1\ 0_k \rightarrow 0_k 1}$ and $E_{0_k 1 \rightarrow 1\ 0_k}$, the decision is based on the accumulated branch metrics for the two alternative paths which are $$B_s = \frac{1}{2} - r_i \text{ and } B_d = \frac{1}{2} - r_j.$$

The Viterbi detector chooses the $\{0_k 1\}$ path if $$\frac{1}{2} - r_j < \frac{1}{2} - r_i,$$

which is the equivalent to choosing that path if $$r_j - r_i > EQ\ 0.$$

Let $r \triangleq r_j - r_i$. Then r is a Gaussian random variable with variance $\sigma_r^2 = 2\sigma^2$. When the path corresponding to the stored data is $\{0_k 1\}$, the mean $\mu_d = 1$, but when the recorded path is $\{1 0_k\}$, the mean $\mu_s = -1$. In either case, we can define $$P_2 \triangleq P[E_{10_k \rightarrow 0_k 1}] = P[E_{0_k 1 \rightarrow 10_k}] = \Phi\left(-\frac{1}{\sqrt{2}\ \sigma}\right) = \frac{1}{2}\left[1 - \text{erf}\left(\frac{1}{2\sigma}\right)\right].$$

In the situations of error events $E_{0_k v \rightarrow v0_k}$ and $E_{v0_k \rightarrow 0_k v}$, the detector decision is based on the accumulated branch metrics for the two alternative paths which are $$B_s = v^2/2 - vr_i \text{ and } B_d = v^2/2 - vr_j.$$

The Viterbi detector chooses the $\{v0_k\}$ path if $$v^2/2 - vr_j > v^2/2 - vr_i,$$

which is equivalent to choosing that path if $$r_j - r_i \geq 0.$$

Let $r \triangleq r_j - r_i$. Then r is a Gaussian random variable with variance $\sigma_r^2 = 2\sigma^2$. When the path corresponding to the stored data is $\{0_k v\}$, the mean $\mu_d = v$, but when the corresponding stored data path is $\{v0_k\}$, the mean $\mu_s = v$. In either case, we can define $$P_3 \triangleq P[E_{v0_k \rightarrow 0_k v}] = P[E_{0_k v \rightarrow v0_k}] = \Phi\left(\frac{v}{\sqrt{2}\ \sigma}\right) = \frac{1}{2}\left[1 - \text{erf}\left(-\frac{v}{2\sigma}\right)\right].$$

These conditional probabilities are weighted by the probability of using the pattern corresponding to the stored data and summed to get the overall probability of error events. Given random binary inputs, the overall error event probability using the optimal metrics is given by $$P_{e,opt} = \frac{1}{2}[2P_1 + P_2 + P_3].$$

Figure 6A:
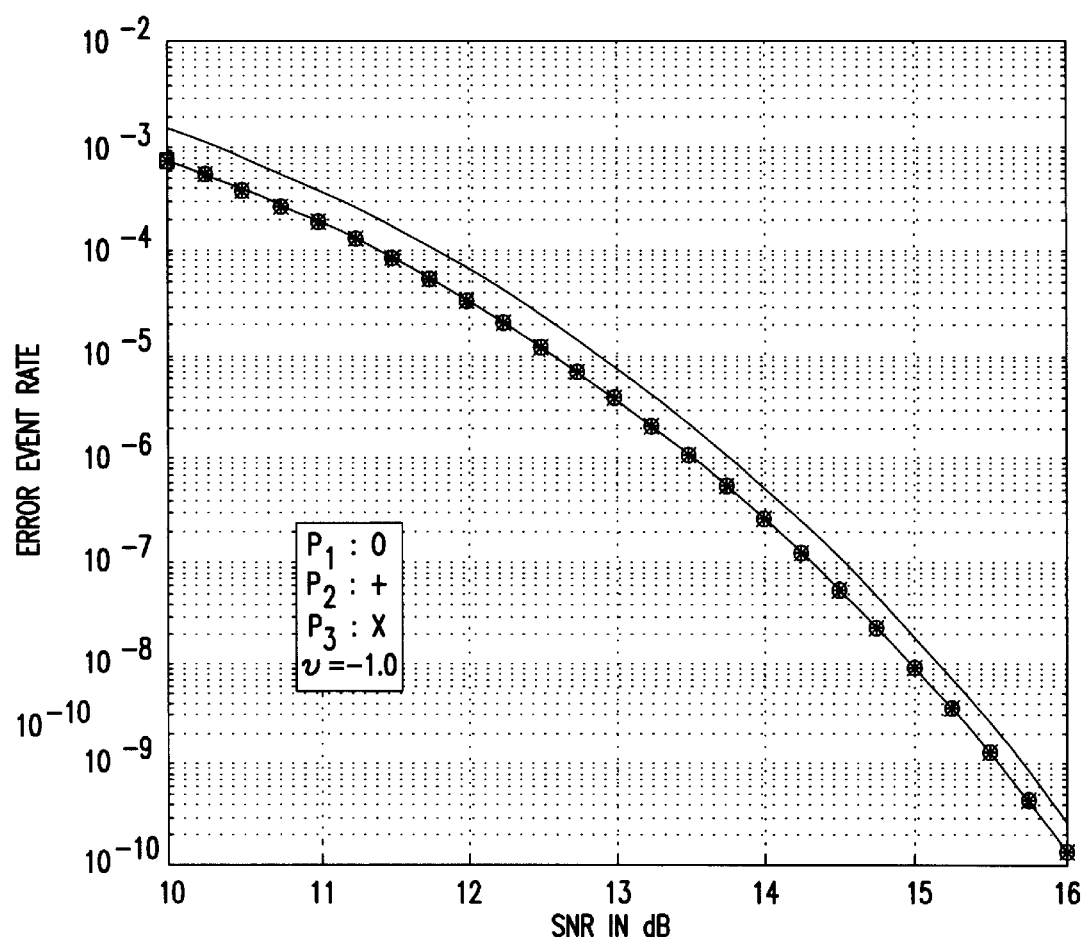
FIGS. 6A, 6B, 6C, 6D and 6E show graphs with plots of probable error rates associated with data detectors using alternative detection arrangements.
Figure 6B:
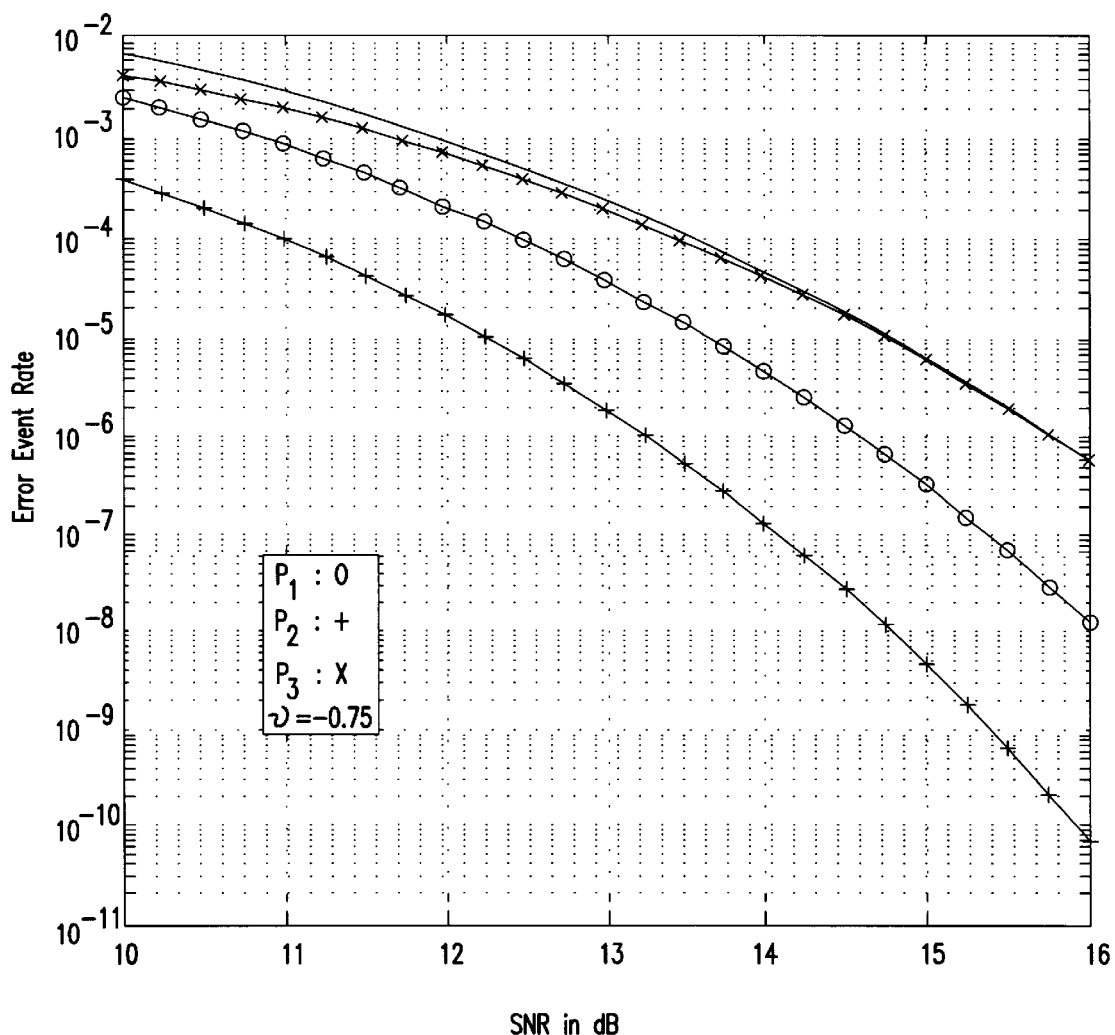
Figure 6C:
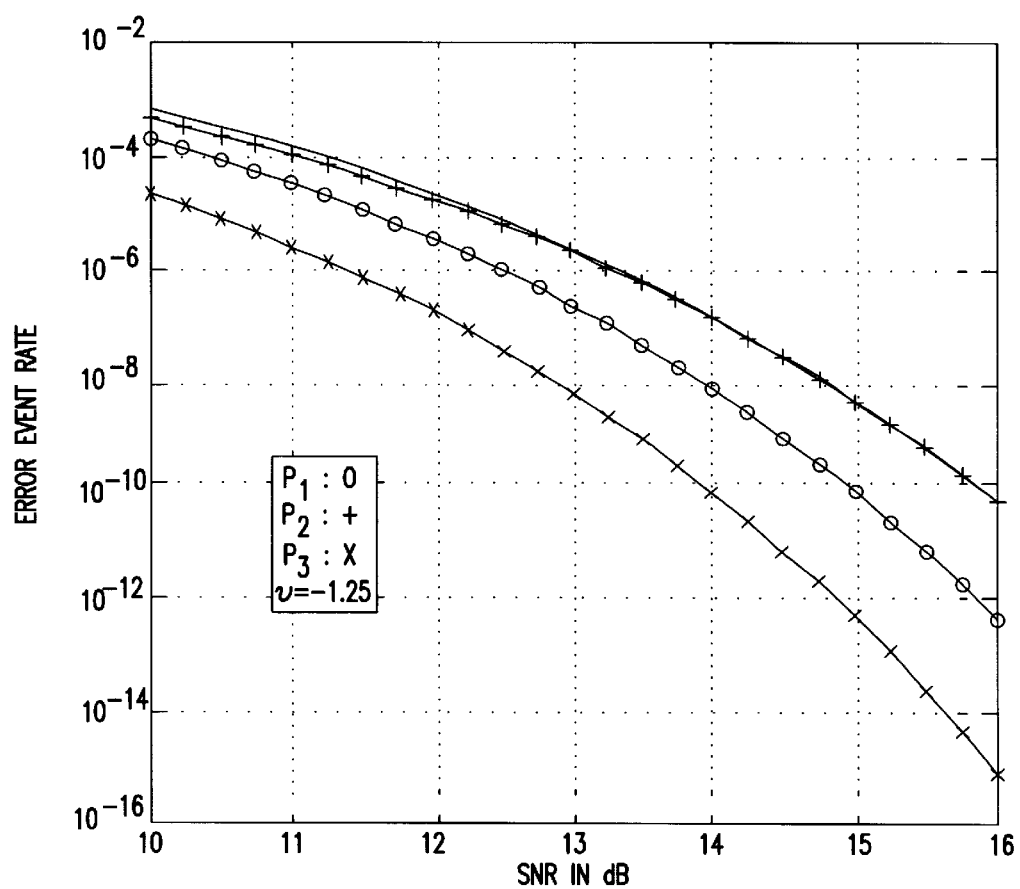

In FIGS. 6A, 6B, and 6C, theoretical curves are shown for the error event probability $P_{e,opt}$, and the components thereof, versus signal-to-noise ratio ($20\log 10\sqrt{2}/2\sigma$) for optimal detection of asymmetric signals. FIG. 6A depicts the error event rate when there is no asymmetry, i.e., when $v = -1.0$. The curve without plotting point markings thereon represents $P_{e,opt}$, and the curves for the conditional probability components $P_1$, $P_2$ and $P_3$ are identical. In FIG. 6B, $v = -0.75$ with the curve without plotting point markings thereon again representing $P_{e,opt}$. When the absolute value of $v$ is smaller than one, probability $P_3$ dominates the performance, and causes severe degradation in error rate compared to the $v = -1.0$ situation, i.e. $P_{e,opt}$ has greater values across the signal-to-noise ratio range shown. In FIG. 6C, $v = -1.25$ with once more the curve without plotting point markings thereon representing $P_{e,opt}$. When the absolute value of $v$ is larger than one, probability $P_2$ dominates the performance, and an asymptotic improvement of ¼ in the error rate is seen compared to the $v = -1.0$ situation over most of the signal-to-noise ratio range shown.

Next, the error events are analyzed when the simplified branch metrics, given above as $B_{in} = r_i - v/2$, $B_{iz} = 0$, and $B_{ip} = ½ - r_i$, are used. Consider the error events $E_{0_k \rightarrow 10_{k-2}v}$, $E_{10_{k-2}v \rightarrow 0_k}$, $E_{v0_{k-2}1 \rightarrow 0_k}$ and $E_{0_k \rightarrow v0_{k-2}1}$ where the accumulated branch metrics for the paths are $$B_s = ½ - r_i + r_j - v/2 \text{ and } B_d = 0.$$

The Viterbi detector chooses the solid path if $B_s < B_d$, i.e., if $$r_j - r_i < \frac{v-1}{2}.$$

Let $r \triangleq r_j - r_i$. Then r is a Gaussian random variable with variance $\sigma_r^2 = 2\sigma^2$, and conditional means $\mu_s = v - 1$ and $\mu_d = 0$.

The equal conditional error event probabilities are $$P_4 \triangleq \Phi\left(\frac{v-1}{2\sqrt{2}\ \sigma}\right) = \frac{1}{2}\left[1 - \text{erf}\left(\frac{1-v}{4\sigma}\right)\right].$$

The analyses for the simplified branch metrics are unchanged from the optimal branch metric analyses for the error events $E_{1\ 0_k \rightarrow 0_k 1}$ and $E_{0_k 1 \rightarrow 1\ 0_k}$ to again yield the conditional error event probability $P_2$.

Consider next error events $E_{0_k v \rightarrow v0_k}$ and $Ev_{0_k \rightarrow 0_k}v$ for which the accumulated branch metrics using the simplified branch metrics are $B_s = r_i - v/2$ and $B_d = r_j - v/2$. The viterbi detector chooses the dashed line path if $B_d < B_s$, i.e., if $r_j - r_i < 0$. This results in equal conditional error probabilities for these error events of $P_3$.

Given random binary inputs, the overall error event probability using the simplified branch metrics is given by $$P_{e,simp} = \frac{1}{2}[2P_4 + P_2 + P_3].$$

Figure 6D:
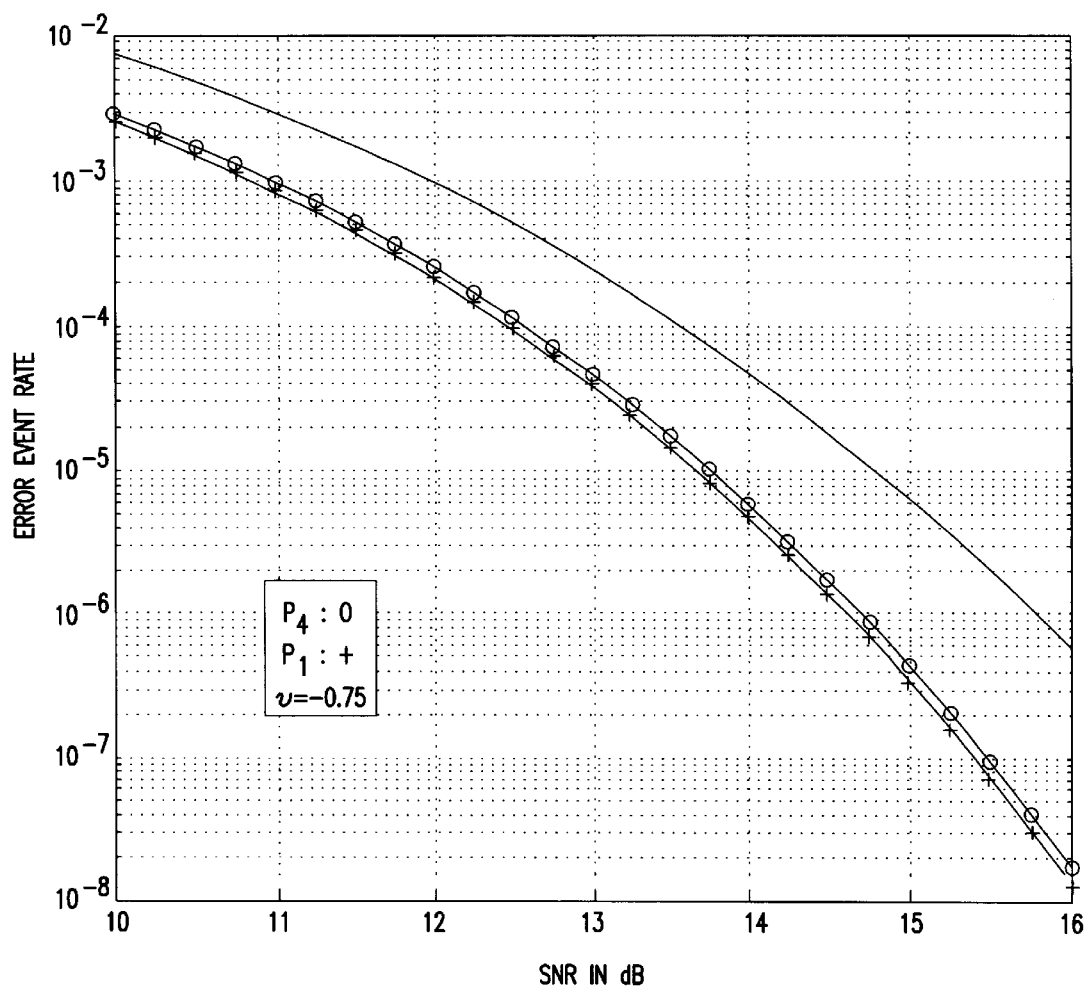

In FIG. 6D, the conditional probabilities $P_1$ and $P_4$ and the overall error event probability $P_{e,simp}$ are plotted for the simplified branch metrics, along with the overall probability $P_{e,opt}$ for the optimal branch metrics for $\upsilon=-0.75$. Although $P_4$ is slightly larger than $P_1$, its overall contribution to the error event rate is small so that the net increase in error rate is approximately 1% at a 16 dB SNR resulting in the curves for the overall probabilities $P_{e,opt}$ and $P_{e,simp}$ appearing to be the same ve in that figure.

Finally, the error events are analyzed when the standard branch metrics, given above as $B_{in}=r_i+\frac{1}{2}$, $B_{iz}=0$, and $B_{ip}=\frac{1}{2}-r_i$, are used. Consider first the error events $E_{0_k \to 1\ 0_{k-2}\upsilon}$ and $E_{1\ 0_{k-2}\upsilon-0_k}$ where the accumulated branch metrics using the standard branch metrics are $$B_s = \frac{1}{2} - r_i + \frac{1}{2} + r_j$$

and $$B_d = 0$$

The Viterbi detector chooses the solid line path if $B_s < B_d$, i.e., if $r_j - r_i < -1$. Let $r \triangleq r_j - r_i$ so that $r$ is a Gaussian random variable with variance $\sigma_r^2 = 2\sigma^2$, and conditional means $\mu_s = \upsilon - 1$ and $\mu_d = 0$. The conditional probabilities then found are $$P[E_{0_k \to 1 0_{k-2}\upsilon}] = P[E_{0_k \to \upsilon 0_{k-2} 1}]$$
$$= \Phi\left(\frac{1}{\sqrt{2}\ \sigma}\right)$$
$$= \frac{1}{2}\left[1 - \text{erf}\left(\frac{1}{2\sigma}\right)\right]$$
$$= P_2,$$

and $$P[E_{10_{k-2}\upsilon \to 0_k}] = P[E_{\upsilon 0_{k-2} 1 \to 0_k}]$$
$$= \Phi\left(\frac{\upsilon}{\sqrt{2}\ \sigma}\right)$$
$$= \frac{1}{2}\left[1 - \text{erf}\left(\frac{-\upsilon}{2\sigma}\right)\right]$$
$$= P_3.$$

For error events $E_{1\ 0_k \to 0_k 1}$ and $E_{0_k 1 \to 1\ 0_k}$, the accumulated branch metrics using the standard branch metrics are unchanged from the accumulated branch metrics found in using both the optimal and the simplified branch metrics resulting in conditional probability $P_2$.

For error events $E_{0_k \upsilon \to \upsilon 0_k}$ and $E_{\upsilon 0_k \to 0_k \upsilon}$, $\upsilon$ the accumulated branch metrics in the standard metric situation are $B_s = \frac{1}{2}+r_i$ and $B_d = \frac{1}{2}+r_j$. The Viterbi detector chooses the dashed line path if $B_d < B_s$, i.e. if $r_j - r_i < 0$. This results in the conditional probability of error $P_3$.

The overall probability of error events using the standard branch metrics is given by $$P_{e,standard} = P_2 + P_3.$$

Figure 6E:
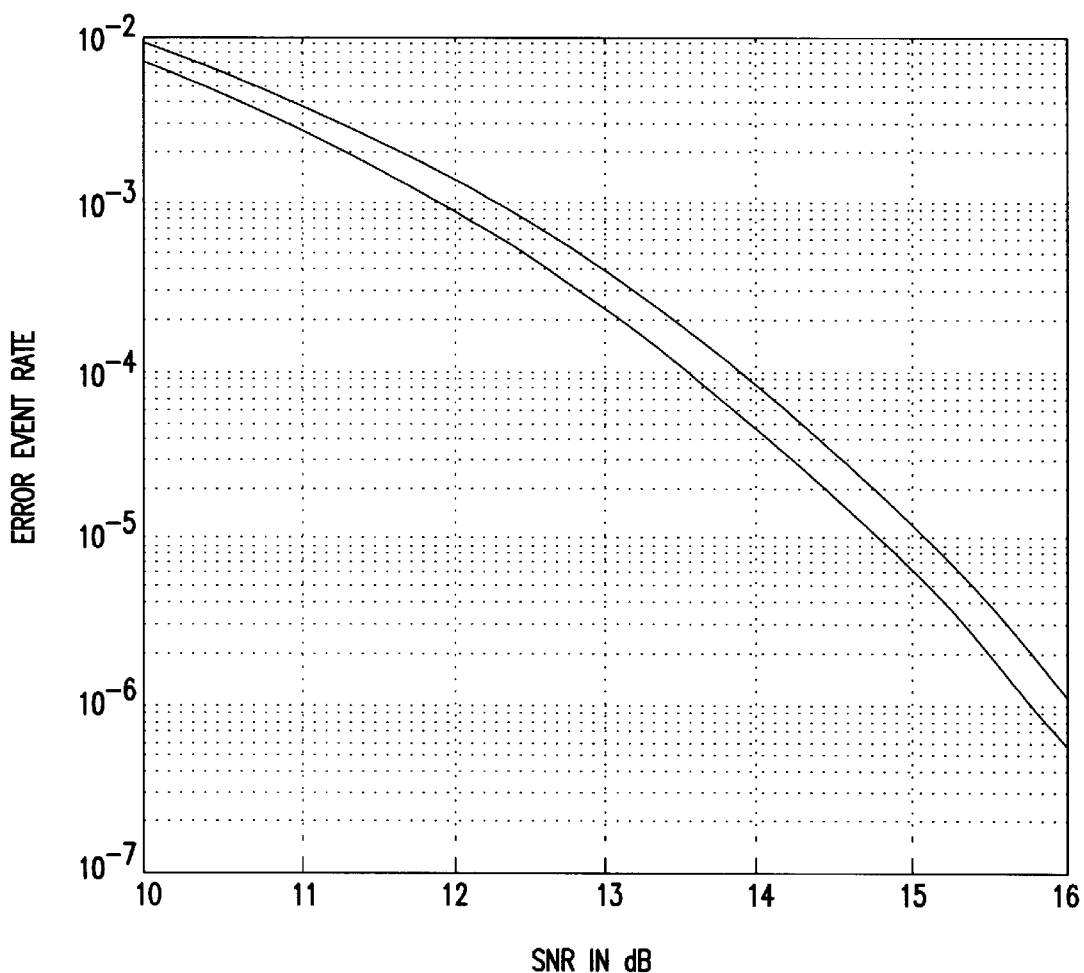

Referring to the table set out above, FIG. 6B and FIG. 6D, one can compare the use of standard branch metrics on asymmetric channels with the foregoing optimal or simplified branch metrics. By using standard branch metrics, the conditional probability component $P_1$ of optimal probability $P_{e,opt}$, or the conditional probability component $P_4$ of simplified probability $P_{e,simp}$ is effectively degraded to either probability $P_2$ or $P_3$ as can be seen by comparing the equation for $P_{e,standard}$ with the equations for either $P_{e,opt}$ or $P_{e,simp}$. Since probability $P_3$ dominates the error event rate in FIG. 6B for optimal probability $P_{e,opt}$, for instance, and since with standard metrics twice as many error events have probably $P_3$ as seen by comparing the equations for $P_{e,opt}$ and $P_{e,standard}$, the overall error event rate becomes degraded from $P_{e,opt}$ to $P_{e,standard}$ by approximately a factor of 2. This is shown in FIG. 6E where the error event performance of the standard branch metric is compared to that of the optimal branch metric. The use of further coding schemes in the stored data, such as trellis codes, also lead to error rates degrading when using standard branch metrics rather than optimal or simplified branch metrics.

Figure 7:
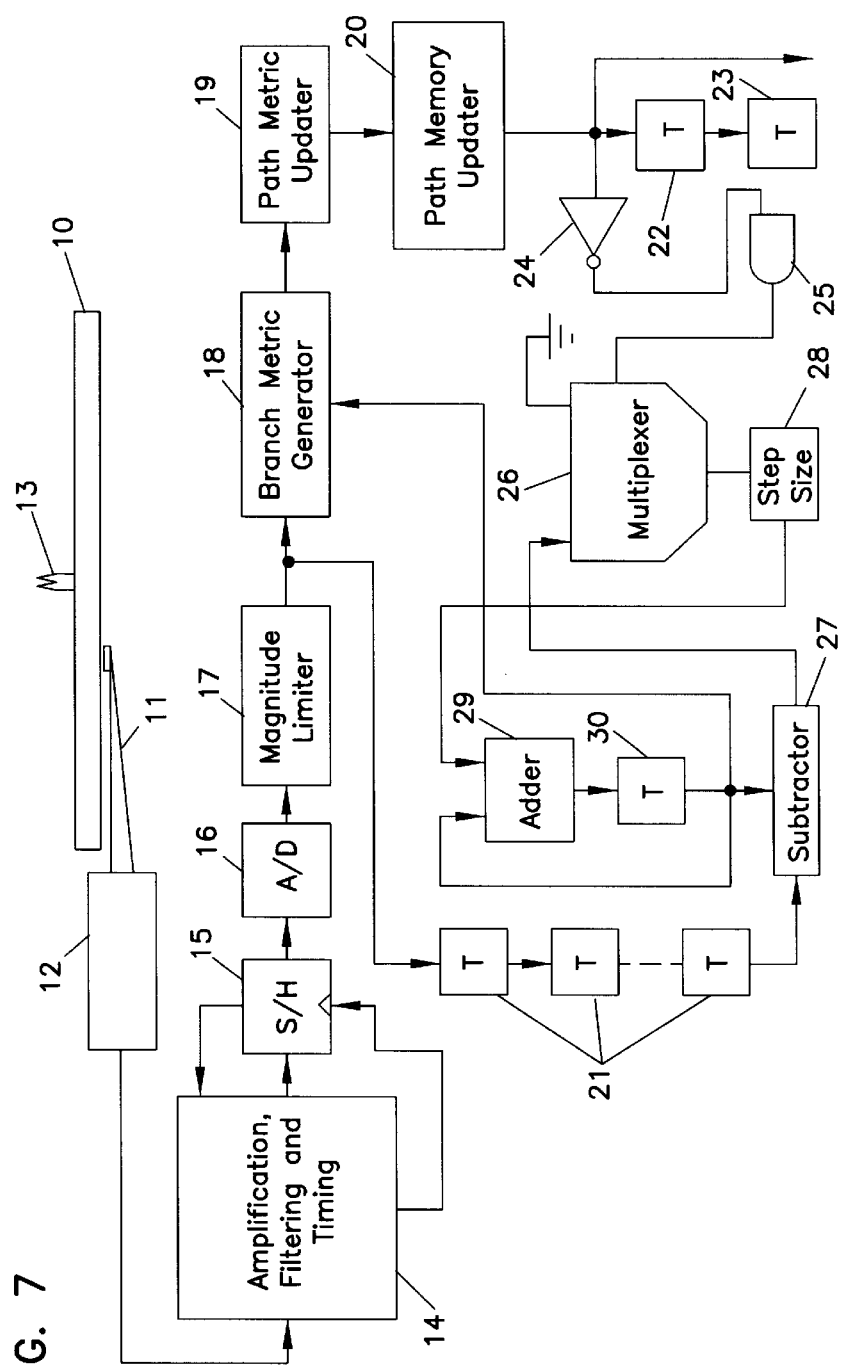
FIG. 7 shows a mixed block and logic diagram of a system embodying the present invention.

FIG. 7 shows a system for using the simplified or optimal branch metrics in a Viterbi detector in the presence of data retrieval channel asymmetry in a dicode channel. In the system of FIG. 7, a magnetic material covered disc, 10, containing pluralities of magnetization direction reversals along each of a plurality of more or less concentric, circular tracks, is rotated past a data retrieval transducer arrangement, 11, or "read head", positioned adjacent a selected track by a "head" positioner and initial signal processor, 12, about a spindle, 13, to provide an initial analog read signal x(t). This signal is subjected to further processing in a signal processing block, 14, including variable gain amplification and linear channel equalization. The output from signal processing block 14 is an analog output signal y(t) which is provided to a sampler, 15, based on a sample and hold circuit which is operated by a sample acquisition timing signal provided by signal processing block 14 that is derived from the samples provided by sampler 15 to that signal processing block.

The analog samples, $y_i$, obtained by sampler 15 are sent to an analog-to-digital converter, 16, where they are converted to digitized samples having six bit digital values in 2's complement form. After these digital samples are passed through a magnitude limiter, 17, each such constrained sample, $r_i$ is passed to a branch metric generator, 18, as part of a Viterbi detector comprising metric generator 18 and further comprising a subsequent path metric updater, 19, and a path memory updater, 20, implemented in well known configurations. The output signal from path memory updater 20 comprises the estimates by the Viterbi detector of the binary non-return to zero inverted (NRZI) digital data values, $\hat{x}_i$, of the stored data values, $x_i$.

The samples $r_i$ are also provided to a delay line, 21, comprising delay elements each providing a delay of one sampling period duration, T. The number n of delay elements present is that which is necessary for delay line 21 to match the delay in providing samples to, and obtaining corresponding data values from, the Viterbi detector. Thus, the digital samples emerging from delay line 21, $r_{i-n}$ are correlated in time with the estimated data values provided at the output of path memory updater 20. These digital data value estimates at the output of path memory updater 20, in addition to being supplied to the subsequent system portions using such data for the purposes for which the magnetic storage system is desired, are also supplied to two further delay elements, 22 and 23, which each delay the samples one sampling period duration T. Thus, if the output of path memory updater is an estimated stored digital data value $\hat{x}_i$, the output of delay element 23 will be delayed estimated stored digital data value $\hat{x}_{i-2}$.

The estimated stored digital data values $\hat{x}_i$ provided at the output of path memory updater 20 are also supplied to a logic inverter, 24, from which the resulting inverted logic values thereof are further supplied to an input of an AND gate, 25. The delayed estimated stored digital data values at the output of delay element 23 are provided to the other input of AND gate 25. Thus, AND gate 25 receives logically inverted estimated stored digital data values of $\hat{x}_i$ at one input thereof, and delayed estimated stored digital data values $\hat{x}_{i-2}$ at the other input thereof. When an output estimated stored digital data value from path memory updater 20 equals a logical "0" value at the same time the two sample period delayed estimated stored digital data value $\hat{x}_{i-2}$ equals a logical "1" value, the corresponding channel sample value is expected to have a negative value as described above. On those occasions, the output of AND gate 25, connected to the selection input of an analog multiplexer, 26, goes to a logical "1" value to thereby shift which of a pair of inputs of that multiplexer is connected to the output thereof.

In the situations in which the output of AND gate 25 presents a logical "0" value at its output, a zero value represented by the ground symbol connected to a zero value input of multiplexer 26 is connected to the output thereof. In the alternative situations in which a logical "1" value is provided at the output of AND gate 25, the signal value at the other input, the difference input, of multiplexer 26 is connected to the output thereof, this value representing the difference between the current estimated value for υ (the expected value of samples when a sample value of −1 is otherwise expected to occur in the presence of channel asymmetry) and the value of the delayed sample $r_{i-n}$.

This difference is obtained in a subtractor, 27, having its output connected to the input of multiplexer 26. One input of subtractor 27 is connected to delay line 21 to receive delayed sample $r_{i-n}$. The other input to subtractor 27 is the one sample period earlier estimated value of υ as will be seen in the following. The difference found in subtractor 27 is supplied to the difference input of multiplexer 26 to be provided to the output thereof when AND gate 25 has a logical "1" value at its output. This difference value passed through multiplexer 26 is provided to a step size limiter, 28, to keep changes in the estimated value for υ sufficiently small for loop stability purposes and then provided to an input of an adder, 29. The one sample period earlier estimate for υ is supplied to the other input of adder 29, and that estimate of υ is combined with the limited value of the difference determined in subtractor 27 to form a value in adder 29 representative of an arithmetic average thereof to provide the current estimated value of υ at the output of adder 29. This output is delayed through a further delay element, 30, of a duration equal to one sample period and provided as the next estimate for υ that is supplied to subtractor 27 and, as stated previously, to the input of adder 29. In addition, this next estimate of υ is provided to branch metric generator 18 for the purpose of being used in forming either optimal or simplified branch metrics.

Figure 8:
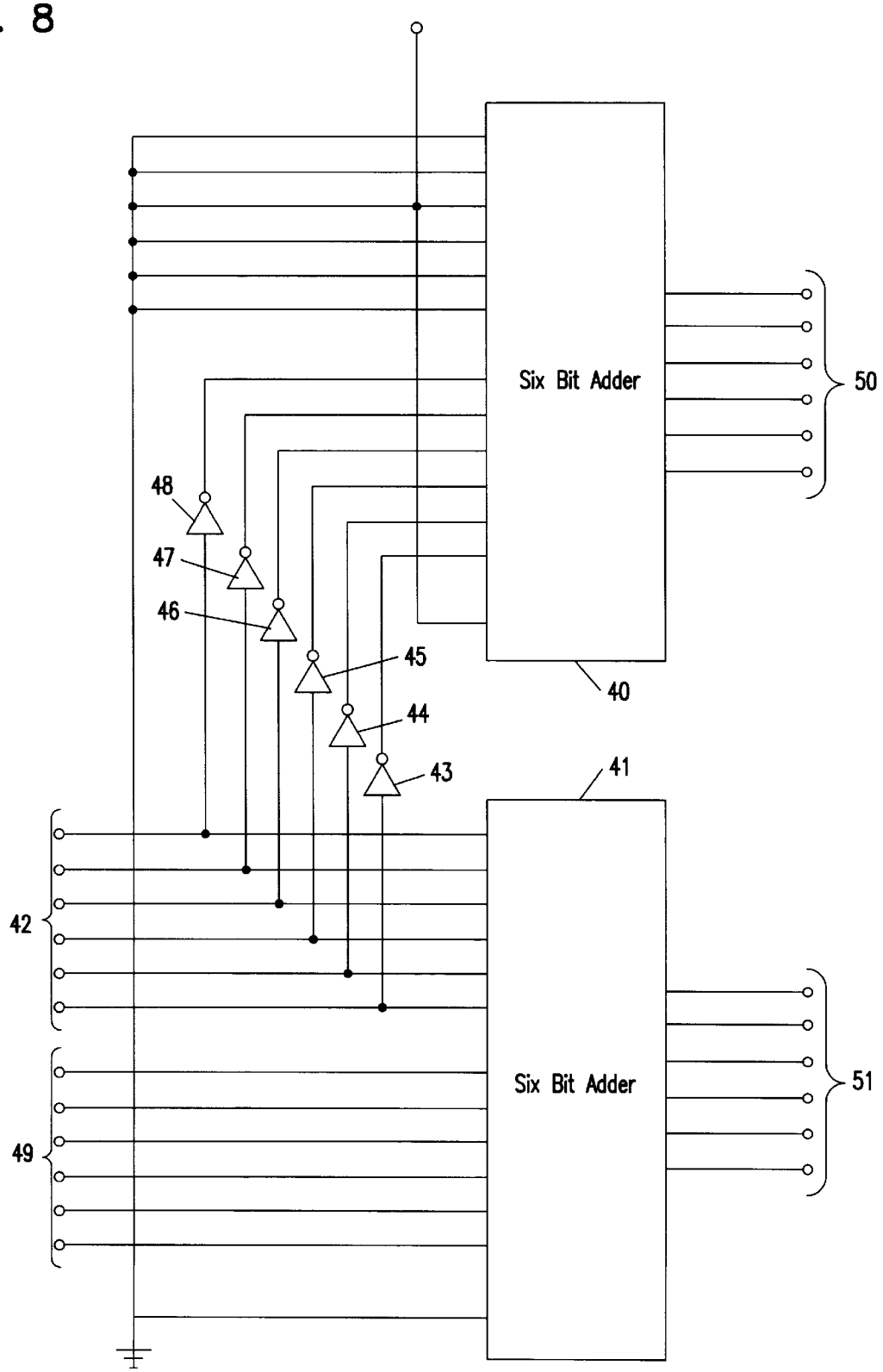
FIG. 8 shows a logic diagram of a portion of the system shown in FIG. 7.

Since simplified branch metrics require considerable less signal processing than do the optimal branch metrics, they are preferred for use in branch metric generator 18. FIG. 8 shows an implementation for branch metric generator 18 using the simplified branch metric. Two six bit adders, 40 and 41, are provided each having an upper six inputs and a lower six inputs on the left side thereof with the logical values on these two sets of inputs being added together in the corresponding adder to provide the logical values at the six outputs thereof on the right-hand side thereof. In addition, a further carry-in input is provided on the left side of each of these adders below the lowest six inputs thereof. Adder 40 provides the calculation for the branch metric $B_{ip}$,½−$r_i$, and adder 41 provides a calculation of branch metric $B_{in}$=$r_i$−υ/2. No calculation is required for the branch metric $B_{iz}$=0.

A sample value $r_i$ is supplied to the six upper generator inputs, 42, on the left side of FIG. 8. These values are directly supplied to the upper six inputs of adder 41, and they are further applied to the inputs of six corresponding logical inverters, 43 through 48. The outputs of logical inverters 43 through 48 are connected to the lower six inputs of adder 40. Thus, the complements of the bits of sample $r_i$ are provided to the lower six inputs of adder 40 to provide the negative thereof in 2's complement form. The estimate of υ from delay element 30 is halved and supplied to the lower five generator inputs, 49, on the left side of FIG. 8. These binary digits for υ are thus supplied to the lower five inputs on the left side of adder 41. The sixth of the lower inputs is connected to ground to give a zero value since the value of υ will be negative as supplied so the sign bit for that quantity is set to the logical value "0" for 2's complement purposes.

Finally, the value of ½ is provided to the upper six inputs on the left side of adder 40 by connecting the fourth digit to the voltage value assigned for a logical value of "1" with the remainder of those inputs connected to ground to provide logical "0" values thereto. The carry-in input of adder 40 is set to a logical "1" value, and the carry-in input of adder 41 is set to a logical "0" value. The addition action of adders 40 and 41 then allow the digits of the branch metric $B_{ip}$ to appear on the generator outputs, 50, on the right side of adder 40 and the digits of the branch metric $B_{in}$ appear on the generator outputs, 51, on the right side of adder 41.

Although the present invention has been described with reference to preferred embodiments, workers skilled in the art will recognize that changes may be made in form and detail without departing from the spirit and scope of the invention.

What is claimed is:

1. A data symbol sequence detector for choosing data symbol sequences likely to be represented by corresponding sequences of samples received by said detector of data signals obtained from magnetically stored data through a data retrieval channel asymmetrically affecting magnitudes of said data signals, said detector comprising:

an expected sample value estimator for providing statistically estimated expected magnitude values for at least one corresponding selected set of said samples in said sequence of samples; and a magnitude difference determiner for obtaining representations of differences between values of said samples in said sequence of samples and corresponding estimated expected values received from said expected sample value estimator.

2. The apparatus of claim 1 wherein said representations of said differences are formed by squaring at least some of said differences.

3. The apparatus of claim 1 wherein said representations of differences for each of said samples in said sequence of samples are magnitudes at least some of which are formed using said value for that said sample and those said estimated expected values corresponding thereto without squaring that value of that said sample.

4. The apparatus of claim 1 wherein said representations of differences for each of said samples in said sequence of samples are magnitudes at least some of which are formed using said value for that said sample and those said estimated expected values corresponding thereto without squaring values of those said corresponding estimated expected values in any of those representations of differences in which that sample is involved.

5. The apparatus of claim 1 wherein said expected value estimator is an averager that provides an estimated sample value by determining an arithmetic average value from samples in said sequence of samples determined to be in said corresponding sample magnitude range.

6. The apparatus of claim 2 wherein said representations of differences for each of said samples in said sequence of samples are magnitudes at least some of which are formed using said value for that said sample and those said estimated expected values corresponding thereto without squaring values of those said corresponding estimated expected values in any of those representations of differences in which that sample is involved.

7. The apparatus of claim 1 wherein said detector is a Viterbi detector and said magnitude difference determiner provides said representations of differences for determining branch metric values therein.

8. The apparatus of claim 5 wherein said arithmetic average value is obtained by combining estimated sample values and differences between samples in said sequence of samples and previously estimated sample values.

* * * * *